United States Patent [19]

Boudewijns et al.

[11] 4,159,430
[45] Jun. 26, 1979

[54] CHARGE TRANSFER DEVICE FOR PROCESSING VIDEO-FREQUENCY SIGNALS

[75] Inventors: Arnoldus J. J. Boudewijns; Bernardus H. J. Cornelissen, both of Eindhoven, Netherlands

[73] Assignee: U.S. Philips Corporation, New York, N.Y.

[21] Appl. No.: 830,649

[22] Filed: Sep. 6, 1977

[30] Foreign Application Priority Data

Sep. 17, 1976 [NL] Netherlands .......................... 7610351

[51] Int. Cl.² ............................................ H03K 23/00
[52] U.S. Cl. .................................. 307/221 D; 357/24
[58] Field of Search ....................... 358/160, 186, 188; 307/208, 221 D; 357/24

[56] References Cited

U.S. PATENT DOCUMENTS 4,032,952   6/1977   Ohba et al. ................... 307/22 D X

*Primary Examiner*—Robert L. Richardson
*Attorney, Agent, or Firm*—Thomas A. Briody; Edward J. Connors, Jr.; Steven R. Biren

[57] ABSTRACT

A charge transfer device of the bulk CCD type is used as an electronic variable delay line for video frequency signals. Charge packets are formed by integration of the input signal current over the entire clock period of the clock signal. As a result, cross-talk of the clock signal to the input section does not affect the video signal to be processed. Furthermore, the nonlinear characteristic of the input current source is linearized by negative current feedback with the aid of an operation amplifier. The input section of the device includes a diffused input region and a first gate electrode for receiving an input signal, and a second gate electrode for receiving a substantially constant voltage.

3 Claims, 4 Drawing Figures

CHARGE TRANSFER DEVICE FOR PROCESSING VIDEO-FREQUENCY SIGNALS

The invention relates to a charge transfer device having a semiconductor body, for the processing of video-frequency signals, comprising a semiconductor layer of the one conductivity type, means being provided for insulating the semiconductor layer from the surrounding, and said layer having such a thickness and a doping concentration as to permit a depletion zone to be obtained with the aid of an electric field throughout the thickness of the semiconductor layer without the occurrence of breakdown, means being provided for locally introducing information in the form of charge into the semiconductor layer and means for reading said information elsewhere in the layer, while at least on one side of the layer an electrode system is provided for capacitively generating electric fields in the semiconductor layer with the aid of which the charge can be transferred to the read means through the semiconductor layer in a direction parallel to the layer.

In this respect the term electrode system is to be understood in a wide sense, so that it also includes electrodes which are isolated from the semiconductor layer by a barrier layer or insulator.

Such a semiconductor device is described in Netherlands Patent Application 7114770, which corresponds to U.S. Ser. No. 866,004. In this semiconductor device the electrical charge is transferred at least substantially via the interior of the semiconductor layer. It is in this respect that a semiconductor device of the type as described in the said Netherlands Patent Application differs from the generally known charge-coupled devices in which storage and transport of the electric charge takes place at the surface of the semiconductor layer. As in general the mobility of electric charge carriers is lower than in the interior of the semiconductor layer owing to surface conditions at the surface of the semiconductor layer and as in general the distance between the elements and the electric charge in the interior of the semiconductor layer is comparatively great, so that stronger transverse fields occur in the direction of transfer, the transfer of electric charges via the interior of the semiconductor layer will be fast relative to the transfer of a corresponding amount of charge along the surface of the semiconductor layer.

As a result a semiconductor device of the type described hereinbefore can be operated with the aid of clock voltages of a comparatively high frequency. This inter alia has the advantage that for example when such a semiconductor device is used in delay lines for video frequency signals, the maximum frequency of these video frequency signals to be passed through the shift register can be comparatively high.

In most cases the semiconductor layer is formed by a surface layer which adjoins a surface of the semiconductor body, which layer at this surface is covered by an insulating layer of for example silicon oxide and at the side facing said surface by a blocking pn junction. The lateral isolation of the semiconductor layer may for example be constituted by means which are generally used in integrated semiconductor devices for the insulation of the islands, such as for example a blocked pn junction. The elements with the aid of which clock voltages can be applied in the semiconductor layer, generally consist of electrodes which are arranged on the insulating layer and which are separated from the semiconductor layer by the insulating layer.

During operation, information in the form of a packet of majority charge carriers can be stored in a region of the semiconductor layer opposite a first electrode and can be isolated from other charge packets by means of electric potentials which enclose said region and which extend transversely over the semiconductor layer. During the charge transfer the charge carriers of the said charge packet are transferred from the region layer opposite the first electrode to a following region of the semiconductor layer by applying a voltage difference between said electrode and the next electrode, while at any rate the last charge carriers flow via the interior of the semiconductor layer from the first mentioned region to the next region until the entire region of the semiconductor layer situated opposite said first electrode is depleted. The doping concentration and the thickness of the semiconductor layer should obviously be so low that the semiconductor layer can be depleted over its full thickness without the occurrence of avalanche multiplication. Such a low-doped layer may for example be constituted, as is also indicated in the said Netherlands Patent Application, by a homogeneously doped high-ohmic epitaxial layer which is deposited on a carrier or substrate of the opposite conductivity type.

The write means of charge transfer devices normally comprise an input diffusion of the other conductivity type and one gate electrode, which together with the first stage of the charge transfer device operate as a field-effect transistor with a virtual draining zone. See for example "I.E.E.E. Transactions on Electron Devices," Vol. ED-23, no. 2, February 1976, page 267, FIG. 4. In this known write circuit an input signal is applied between the said input diffusion and the gate electrode. The first gate electrode is connected to the output of an amplifier, whose non-inverting input is connected to a point of constant potential. The inverting input is connected to the input diffusion and via a resistor to the signal source. The said resistor provides negative current feedback and this is additionally amplified by the use of the operational amplifier A. This negative current feedback is necessary in order to reduce the nonlinear character of the current source constituted by the input diffusion and the first gate electrode. However, this reduction is limited by the fact that the amplifier is included in a closed loop, in which switching is effected. The known write circuit is in fact a periodically switched current source. This means that the response time of the amplifier and the time resolution of the switching signal are considerably limited. The slew rate is the most important parameter, because it adds a nonlinear error to the charge packet as a function of the input signal and the non-linear gate-source voltage current characteristic of the input field-effect transistor. Turnon and turn-off delays of the amplifier also give rise to a nonlinear error, if these two delays are not exactly equal to each other. Time jitter in the switching signal gives rise to a linear error which is proportional to the magnitude of the jitter in the switching signal. Said time jitter is moreover frequency-dependent. These disadvantages of the known charge transfer device render it less suitable for use as a variable delay line for video-frequency signals.

It is an object of the invention to solve the last-mentioned problem and the invention is characterized in that the write means are constituted by an input diffusion, which is situated in the semiconductor layer and which is of the same conductivity type but more highly doped, a first and a second gate electrode which are constituted by conductive layers which are isolated from the semiconductor layer by an insulating layer, the input diffusion and the first gate electrode being connected to input terminals for the application of the voltage to be processed and the second gate electrode being connected to a point of substantially constant potential.

The invention will now be described in more detail with reference to the drawing.

Figure 1:
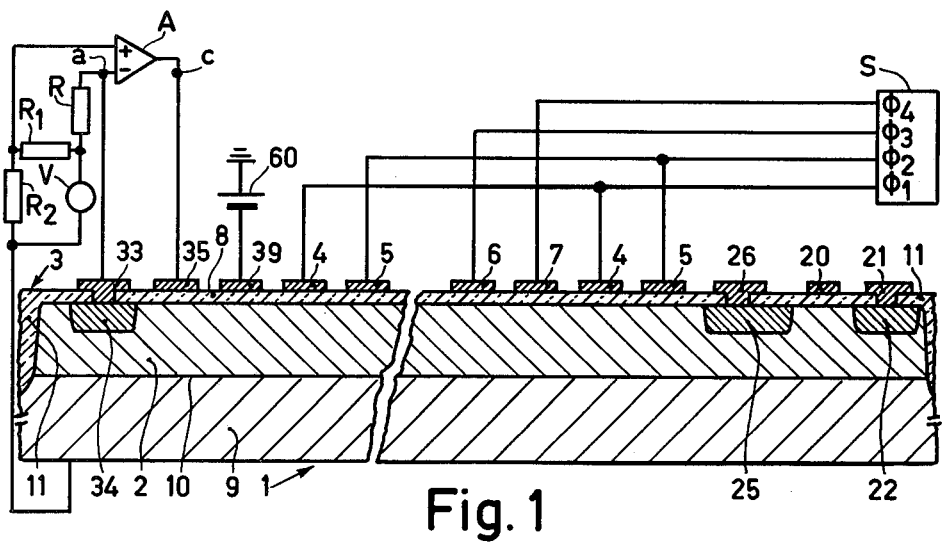
FIG. 1 shows an embodiment of a device in accordance with the invention.

The semiconductor device of FIG. 1 comprises a semiconductor body 1 with a semiconductor layer 2 of n-type silicon. On the semiconductor layer 2 at least at the side 3 of the layer 2 elements are provided for the application of clock voltages, which elements are constituted by the electrodes 4, 5, 6 and 7. In the present embodiment the barrier layer 8 is constituted by an insulating layer of silicon oxide. The electrodes 4, 5, 6 and 7 are constituted by metal tracks of aluminium and serve for the application of clock voltages by which the said charge is conveyed through the semiconductor layer 2 in a direction parallel to the layer 2. During operation of the device the semiconductor layer 2, except for the application and drainage of said charge, is insulated from the surrounding, so that the electric fields obtained in the semiconductor layer 2 and acting on said electric charge are mainly determined by the clock voltages $\phi_1$, $\phi_2$, $\phi_3$ and $\phi_4$ applied to the electrodes 4, 5, 6 and 7, which by way of example are shown as a function of time in FIG. 2. The electrodes 4, 5, 6 and 7 extend in a direction transverse to the charge transfer direction at least over the entire semiconductor layer 2. The thickness and doping concentration of the semiconductor layer 2 are for example 5 $\mu$m and $10^{15}$ atoms/cm$^3$. This thickness and doping concentration are such that in the semiconductor layer 2 an electric field of such a strength can be applied transversely thereto that over the entire thickness of the layer 2 a depletion zone is formed without the occurrence of avalanche multiplication. The layer-shaped region 2 consists of an epitaxial layer, which in the usual manner is deposited on a second region 9 which constitutes a substrate. The upright walls of the island-shaped portion 2 are bounded by an insulation zone 11, which is partly constituted by a layer of silicon dioxide which is inset in the epitaxial layer 2 over a part of its thickness. In the present embodiment the insulation zone is entirely constituted by a layer of silicon oxide which extends from the surface 12 of the semiconductor layer 1 over the entire thickness of the epitaxial layer 2 and into the substrate. Moreover, the oxide layer 11 is inset in the semiconductor body over virtually its full thickness, so that a substantially plane surface is obtained. The semiconductor layer 2 is consequently insulated from the surrounding in an effective manner by the inset silicon oxide layer 11 and the blocking pn-junction 10 and the insulation layer 8.

The charge-coupled device is furthermore provided with means for enabling an amount of charge which has been transported through the semiconductor layer 2 to be read and drained. For this purpose an additional electrode 20 is provided which is insulated from the semiconductor layer 2 by the insulating layer 8 and which constitutes the gate electrode of an insulated gate field-effect transistor. The highly doped n-type region 25 constitutes the source zone of the field effect transistor and the highly-doped n-type region 22 constitutes the draining zone of the field-effect transistor, which region is connected to a conductor 21 for the connection to an external conductor with the aid of which the charge constituting the information can be extracted.

The charge-coupled device is moreover provided with write means, which are constituted by the input diffusion 34, the first gate electrode 35 and the second gate electrode 39. The conductivity type of the input diffusion is of the same type as the conductivity type of the semiconductor layer 2, but more highly doped. The first and second gate electrode 35 and 39 are constituted by conductive layers which are isolated from the semiconductor layer 2 by an insulating layer 8. The input diffusion 34 is connected to the input terminal a via the conductive layer 33 and the first gate electrode 35 is connected to the input terminal c. The input terminal c is connected to the output of the operational amplifier A and the input terminal a is connected to the inverting input (−) of the operational amplifier and moreover via the resistor R to the signal source V. The signal source V is shunted by the series connection of the resistors $R_1$ and $R_2$, whose junction is connected to the noninverting input (+) of the operational amplifier. The second gate electrode 39 is connected to a direct voltage source 60. The substrate 9 is connected to a point of earth potential.

Figure 2:
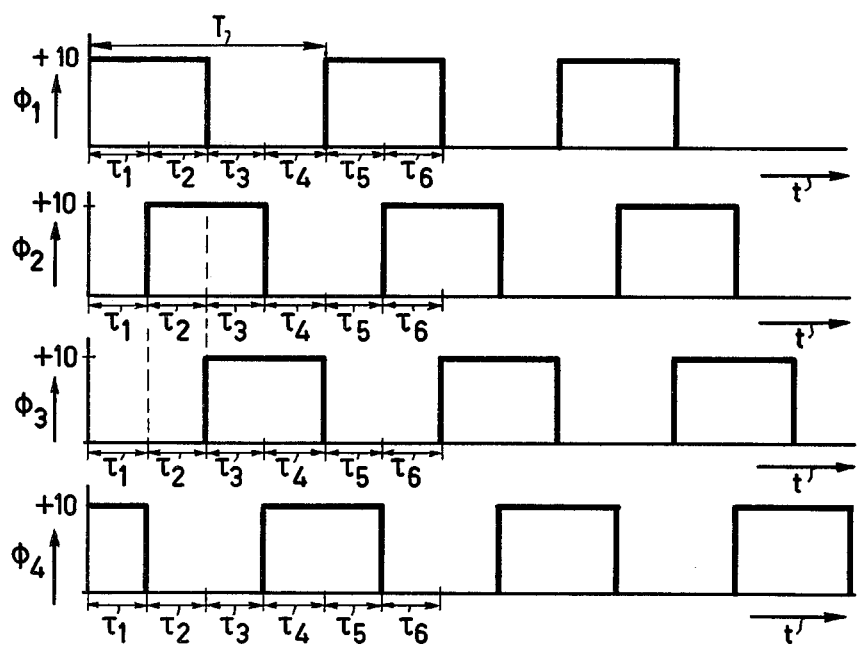
FIG. 2 represents the variation of the clock voltages used as a function of time.
Figure 3:
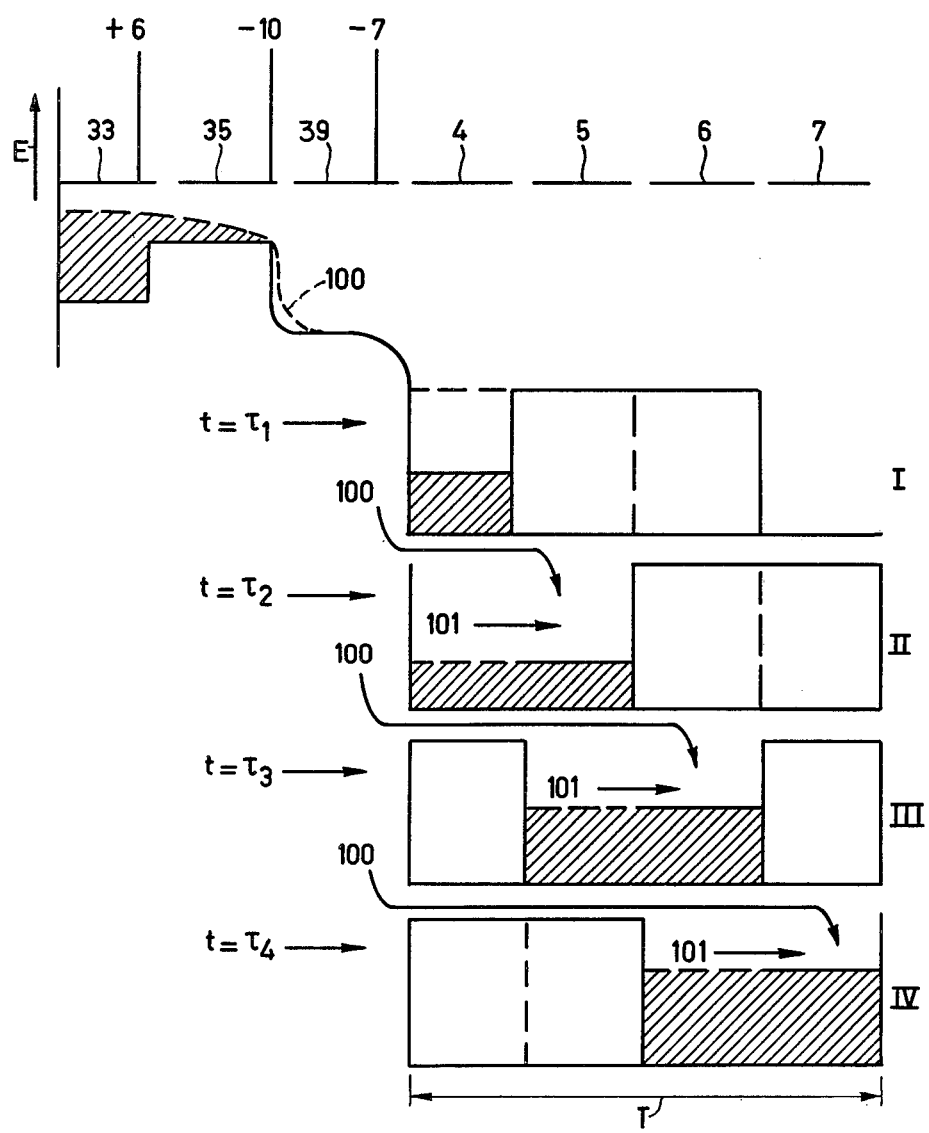
FIG. 3 is a diagram to clarify the operation of the device.

FIG. 3 schematically shows how a charge packet is formed in the charge transfer device in accordance with FIG. 1. As is shown in FIG. 2 the clock voltages vary from 0 to 10 volts. The contact 33 is brought at a d.c. level of +6 V, the first gate electrode at a d.c. level of −10 V, and the second gate electrode 39 at a constant voltage of −7 V, as is indicated in FIG. 3. In the time interval $\tau_1$ the voltage on the electrodes 4 and 7 is +10 V and the voltage on the electrodes 5 and 6 is 0 V. As a result of this, a potential well will be formed underneath the electrodes 4 and 7. In said time interval a signal charge will consequently flow from the region 33 into the potential well underneath the electrode 4 via the current path 100. In the time interval $\tau_2$ the potential on the electrodes 4 and 5 is 0 V and the potential on the electrodes 6 and 7 is 0 V. As a result of this potential, potential wells are formed underneath the electrodes 4 and 5, as shown under II in FIG. 3. Now a charge from the region underneath the electrode 4 will flow to the region underneath the electrode 5 via the current path 101 and signal charge will flow directly from the region 33 into the two potential wells underneath the electrodes 4 and 5 via the current path 100. In the time interval $\tau_3$ the potential on the electrodes 5 and 6 equals +10 V and the potential on the electrodes 4 and 7 is 0 V. As a result of this potential wells are formed underneath the electrodes 5 and 6, as is shown under III in FIG. 3. Now a charge will be transferred from the region underneath the electrodes 4 and 5 to the region underneath the electrode 6 via the path 101 and a signal charge will flow from the region 33 into the two potential wells underneath the electrodes 5 and 6 via the current path 100. In the time interval $\tau_4$ the potential on the electrodes 6 and 7 is +10 and the potential on the electrodes 5 and 6 is 0 V. As a result of this, potential wells are formed underneath the electrodes 6 and 7 as is shown under IV in FIG. 3. Now charge transfer will take place from the region underneath the electrodes 5 and 6 to the region situated underneath the electrode 7 via the current path 101 and a signal charge will flow directly from the region 33 into the potential wells underneath the two electrodes 6 and 7 via the current path 100.

From the above description of the operation of the write circuit in accordance with the invention, it appears that throughout the clock period T signal charge is introduced into the charge transfer device, so that in every clock period T a charge packet of the magnitude Q is formed, which equals $$Q(t) = \int_{t'-T}^{T} I(t) \cdot dt$$

where I(t) is the signal current which flows into the charge transfer device via the current path 100. As now a signal charge flows continuously into the charge transfer device the magnitude of the charge packet has become insensitive to variations of the amplitude and the shape of the clock signal. As switching in the loop is no longer effected, no limits are imposed on the gain and response time of the amplifier. Moreover, owing to the fact that the second gate electrode 39 is maintained at a constant voltage, it is achieved that during the entire clock period T the reaction from the region underneath the electrode 4 and the electrode itself to the region underneath the electrode 35 is substantially reduced, which will reduce the distortion of the signal to be processed.

Figure 4:
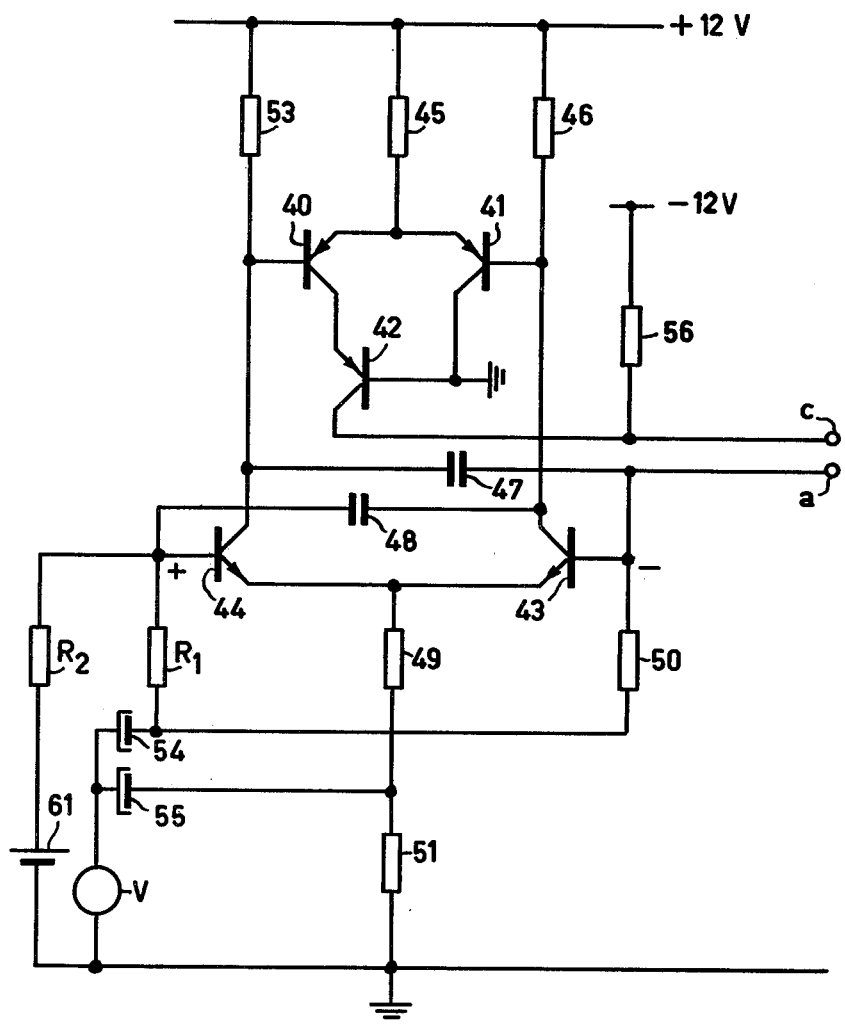
FIG. 4 shows a possible form of the operational amplifier.

By the use of the write circuit in accordance with the invention it is moreover ensured that the required drive can be small, for example 200 mV. As a result of this, it is also accomplished that direct crosstalk from the input to the output of the device is drastically reduced. In voltage-driven charge-coupled devices the required drive voltage is approximately 2 V. It is evident that said cross-talk will be several times greater for this drive. Measurements have revealed that the varying clock frequency still influences the input characteristic of the charge coupled device. The said negative current feedback of the input current provides a simple possibility of reducing this effect. For this purpose the operational amplifier A and the resistors R, $R_1$ and $R_2$ are included in the manner shown. The operational amplifier may for example be realized as is shown in FIG. 4. It comprises a first differential stage constituted by the transistors 40, 41 and 42. The emitters of the transistors 40 and 41 are connected to a point of constant potential. The collector of the transistor 41 and the base of the transistor 42 are connected to a point of, for example, earth potential. The collector of the transistor 40 is connected to the emitter of the transistor 42. The collector of the transistor 42 constitutes the output c of the operational amplifier A. Via the resistor 56 this output c is connected to a point of negative potential. The transistors 40 and 42 together constitute a cascode circuit and ensure that the reaction from the output c to the basis of 40 is reduced. The base of the transistor 40 is connected to a point of positive potential via the resistor 53 and also to the collector of the transistor 44, which forms part of a second differential stage together with the transistor 43. The base of the transistor 41 is connected to a point of positive potential via a resistor 46 and to the collector of the transistor 43. The emitters of the transistors 43 and 44 are connected to a point of earth potential via the resistors 49 and 51. The junction point of the resistors 49 and 51 is connected to the signal source V via the capacitor 55. The base of the transistor 44 constitutes the non-inverting input of the operational amplifier and is connected to the direct voltage source 61 via the resistor $R_2$, to the signal source V via the series connection of the resistor $R_1$ and the capacitor 54, and to the collector of the transistor 43 via the capacitor 48. The base of the transistor 43 constitutes the inverting input of the operational amplifier and is connected to the junction point of the resistor $R_1$ and the capacitance 54 via the resistor 50 and to the collector of the transistor 44 via the capacitance 47, and is connected to the input terminal a.

The drive between the electrodes 33 and 35 in FIG. 3 is now effected with the aid of the voltage between the points a and c. The electrodes 33 and 35 are capacitively coupled to the output 26 of the charge coupled device (FIG. 1). The voltages produced at points a and c are in phase opposition, so that the resulting cross-talk to the output 26 is substantially reduced.

What is claimed is:

1. A charge-coupled device for the processing of video-frequency signals, which comprises:

a semiconductor body of a first type conductivity;

a semiconductor layer of a second type conductivity opposite to that of the first type on said body and having a thickness and a doping concentration such as to permit a depletion zone to be formed throughout the thickness of the semiconductor layer without the occurrence of breakdown upon the application of an electric field;

an insulating layer on said semiconductor layer;

write means for locally introducing information in the form of charge consisting of majority charge carriers into the semiconductor layer, said write means comprising a diffused input region of said second conductivity type in said semiconductor layer and more highly doped than said semiconductor layer, first and second gate electrodes which comprise conductive layers on said insulating layer, input terminals connected to said diffused input region and said first gate electrode for receiving an input signal from an input signal source, and an input terminal connected to said second gate electrode for receiving a substantially constant voltage, said first gate electrode being located between the input terminal to said diffused region and the second gate electrode;

read means for reading out said information from the semiconductor layer at a location remote from said write means; and electrode means on said insulating layer for capacitively generating electric fields in said semiconductor layer in a direction parallel to the semiconductor layer, for transferring charge from said write means and through said semiconductor layer, in a direction parallel to said semiconductor layer, to the read means.

2. A charge coupled device as claimed in claim 1, further comprising:

an operational amplifier, the inverting input of said amplifier being connected to said diffused input region and the output of said amplifier being connected to said first gate electrode;

a first resistor for connecting the inverting input of said amplifier to said input signal source; and two further series-connected resistors shunting said input signal source, the common junction of said resistors being connected to the noninverting input of said amplifier.

3. A charge coupled device as in claim 2, wherein said operational amplifier comprises:

a first differential amplifier stage having two emitter-coupled transistors, the output of said first amplifier stage being coupled to said first gate electrode;

a second differential amplifier stage having two further emitter-coupled transistors, the two collector outputs of said second amplifier stage being connected respectively to the two base inputs of said first amplifier stage, the base of a first of said further emitter-coupled transistors being connected to the inverting input of said operational amplifier and the base of a second of said further emitter-coupled transistors being connected to the noninventing input of said operational amplifier; and a capacitor for coupling the emitters of said further emitter-coupled transistors to the input signal source.

* * * * *